(12) United States Patent
Treadwell et al.

(10) Patent No.: US 10,825,659 B2
(45) Date of Patent: Nov. 3, 2020

(54) SUBSTRATE PROCESSING CHAMBER INCLUDING MULTIPLE GAS INJECTION POINTS AND DUAL INJECTOR

(71) Applicant: Lam Research Corporation, Fremont, CA (US)

(72) Inventors: Jason Lee Treadwell, Gilroy, CA (US); Ivelin Angelov, San Jose, CA (US); Linda Marquez, San Jose, CA (US); Cristian Siladie, Castro Valley, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 514 days.

(21) Appl. No.: 15/399,692

(22) Filed: Jan. 5, 2017

(65) Prior Publication Data

US 2017/0200586 A1 Jul. 13, 2017

Related U.S. Application Data

(60) Provisional application No. 62/275,837, filed on Jan. 7, 2016.

(51) Int. Cl.
*H01J 37/32* (2006.01)
*C23C 16/455* (2006.01)
(Continued)

(52) U.S. Cl.
CPC ........ *H01J 37/3244* (2013.01); *C23C 16/455* (2013.01); *C23C 16/4558* (2013.01);
(Continued)

(58) Field of Classification Search
CPC .......... H01J 37/32422; H01J 37/23257; H01J 37/32082; H01J 21/67069;
(Continued)

(56) References Cited

U.S. PATENT DOCUMENTS 4,262,686 A 4/1981 Heim et al.
4,374,698 A 2/1983 Sanders
(Continued)

FOREIGN PATENT DOCUMENTS

CN 1189859 A 8/1998
CN 102243977 A 11/2011
(Continued)

OTHER PUBLICATIONS

English Machine Translation of KR20080013552 Jeong retrieved from ESPACENET Apr. 14, 2020 (Year: 2020).*
(Continued)

*Primary Examiner* — Rakesh K Dhingra
*Assistant Examiner* — Laureen Chan

(57) ABSTRACT

A gas injector for a substrate processing system includes a first injector housing including a base portion defining a first gas flow channel; a projecting portion extending from the base portion; and a second gas flow channel extending through the base portion and the projecting portion. The gas injector includes a second injector housing including a first cavity including a first opening, a second opening and a first plurality of gas through holes arranged around the second opening. The first gas flow channel communicates with the first plurality of gas through holes. The second injector housing includes a second cavity that includes a second plurality of gas through holes and that extends from the second opening of the first cavity. The second gas flow channel communicates with the second plurality of gas through holes. Gas in the first and second gas flow channels flows into a processing chamber without mixing.

13 Claims, 4 Drawing Sheets

(51) Int. Cl.
*H01L 21/67* (2006.01)
*H01L 21/683* (2006.01)

(52) U.S. Cl.
CPC .. *C23C 16/45508* (2013.01); *H01J 37/32082* (2013.01); *H01J 37/32357* (2013.01); *H01J 37/32422* (2013.01); *H01J 37/32715* (2013.01); *H01L 21/67069* (2013.01); *H01L 21/6831* (2013.01); *H01J 2237/334* (2013.01)

(58) Field of Classification Search
CPC ............ H01J 37/32715; H01J 21/6831; H01J 2237/334; H01J 37/321; H01J 37/3244–32449; H01J 37/3211; C23C 16/455; C23C 16/45574; C23C 16/45508; C23C 16/45548; C23C 16/4558; C23C 16/45563; C23C 16/45565
See application file for complete search history.

(56) References Cited

U.S. PATENT DOCUMENTS

| | | | |
|---|---|---|---|
| 4,431,477 A | 2/1984 | Zajac | |
| 4,793,897 A | 12/1988 | Duffield et al. | |
| 5,329,965 A | 7/1994 | Gordon | |
| 5,346,578 A | 9/1994 | Benzing et al. | |
| 5,605,179 A | 2/1997 | Strong, Jr. et al. | |
| 5,660,673 A | 8/1997 | Miyoshi | |
| 5,662,143 A | 9/1997 | Caughran | |
| 5,744,695 A | 4/1998 | Forbes | |
| 5,762,714 A | 6/1998 | Mohn et al. | |
| 5,792,272 A | 8/1998 | van Os et al. | |
| 5,907,221 A | 5/1999 | Sato et al. | |
| 6,022,809 A | 2/2000 | Fan | |
| 6,042,687 A | 3/2000 | Singh et al. | |
| 6,044,534 A | 4/2000 | Seo et al. | |
| 6,050,283 A | 4/2000 | Hoffman et al. | |
| 6,060,400 A | 5/2000 | Oehrlein et al. | |
| 6,074,959 A | 6/2000 | Wang et al. | |
| 6,143,078 A * | 11/2000 | Ishikawa | H01L 21/67017 118/715 |
| 6,152,168 A | 11/2000 | Ohmi et al. | |
| 6,206,976 B1 | 3/2001 | Crevasse et al. | |
| 6,210,593 B1 | 4/2001 | Ohkuni et al. | |
| 6,217,937 B1 | 4/2001 | Shealy | |
| 6,286,451 B1 * | 9/2001 | Ishikawa | C23C 16/4405 118/723 I |
| 6,328,808 B1 | 12/2001 | Tsai et al. | |
| 6,376,386 B1 | 4/2002 | Oshima | |
| 6,492,774 B1 | 12/2002 | Han et al. | |
| 6,589,352 B1 | 7/2003 | Yudovsky et al. | |
| 6,736,931 B2 | 5/2004 | Collins et al. | |
| 6,744,212 B2 | 6/2004 | Fischer et al. | |
| 6,818,560 B1 | 11/2004 | Koshimizu et al. | |
| 6,841,943 B2 | 1/2005 | Vahedi et al. | |
| 6,896,765 B2 | 5/2005 | Steger | |
| 6,898,558 B2 | 5/2005 | Klekotka | |
| 6,920,312 B1 * | 7/2005 | Benjamin | H01J 37/32082 330/149 |
| 6,962,879 B2 | 11/2005 | Zhu et al. | |
| 7,129,171 B2 | 10/2006 | Zhu et al. | |
| 7,288,482 B2 | 10/2007 | Panda et al. | |
| 7,309,646 B1 | 12/2007 | Heo et al. | |
| 7,338,907 B2 | 3/2008 | Li et al. | |
| 7,757,541 B1 | 7/2010 | Monkowski et al. | |
| 7,758,698 B2 | 7/2010 | Bang et al. | |
| 7,968,469 B2 | 6/2011 | Collins et al. | |
| 8,137,463 B2 | 3/2012 | Liu et al. | |
| 8,552,334 B2 | 10/2013 | Tappan et al. | |
| 8,555,920 B2 | 10/2013 | Hirata et al. | |
| 8,592,328 B2 | 11/2013 | Hausmann et al. | |
| 8,889,024 B2 | 11/2014 | Watanabe et al. | |
| 8,956,980 B1 | 2/2015 | Chen et al. | |
| 8,999,106 B2 | 4/2015 | Liu et al. | |
| 9,011,637 B2 | 4/2015 | Yamamoto | |
| 9,051,647 B2 | 6/2015 | Cooperberg et al. | |
| 9,059,678 B2 | 6/2015 | Long et al. | |
| 9,142,391 B2 | 9/2015 | Yamamoto | |
| 9,318,343 B2 | 4/2016 | Ranjan et al. | |
| 9,471,065 B2 | 10/2016 | Koyomogi et al. | |
| 9,640,409 B1 | 5/2017 | Yang et al. | |
| 2001/0002581 A1 | 6/2001 | Nishikawa et al. | |
| 2001/0004903 A1 | 6/2001 | Ohmi et al. | |
| 2001/0013363 A1 | 8/2001 | Kitayama et al. | |
| 2001/0035530 A1 | 11/2001 | Udagawa | |
| 2002/0038669 A1 | 4/2002 | Yamagishi et al. | |
| 2002/0042205 A1 | 4/2002 | McMillin et al. | |
| 2002/0045265 A1 | 4/2002 | Bergh et al. | |
| 2002/0046991 A1 | 4/2002 | Smith et al. | |
| 2002/0048536 A1 | 4/2002 | Bergh et al. | |
| 2002/0072240 A1 | 6/2002 | Koike | |
| 2002/0078893 A1 * | 6/2002 | Os | C23C 16/4558 118/723 I |
| 2002/0088542 A1 | 7/2002 | Nishikawa et al. | |
| 2002/0160125 A1 | 10/2002 | Johnson et al. | |
| 2002/0174905 A1 | 11/2002 | Latino et al. | |
| 2002/0175144 A1 | 11/2002 | Hung et al. | |
| 2003/0201069 A1 | 10/2003 | Johnson | |
| 2003/0236592 A1 | 12/2003 | Shajii et al. | |
| 2003/0236638 A1 | 12/2003 | Shajii et al. | |
| 2003/0236643 A1 | 12/2003 | Shajii et al. | |
| 2004/0053428 A1 | 3/2004 | Steger | |
| 2004/0089240 A1 | 5/2004 | Dando et al. | |
| 2004/0094206 A1 | 5/2004 | Ishida | |
| 2004/0112538 A1 | 6/2004 | Larson et al. | |
| 2004/0112539 A1 | 6/2004 | Larson et al. | |
| 2004/0112540 A1 | 6/2004 | Larson et al. | |
| 2004/0118678 A1 * | 6/2004 | Hartig | C23C 14/35 204/298.07 |
| 2004/0149389 A1 | 8/2004 | Fink | |
| 2004/0163601 A1 | 8/2004 | Kadotani et al. | |
| 2004/0168719 A1 | 9/2004 | Nambu | |
| 2004/0173270 A1 | 9/2004 | Harris et al. | |
| 2004/0200529 A1 | 10/2004 | Lull et al. | |
| 2005/0005994 A1 | 1/2005 | Sugiyama et al. | |
| 2005/0067021 A1 | 3/2005 | Bevers et al. | |
| 2005/0082007 A1 | 4/2005 | Nguyen et al. | |
| 2005/0155625 A1 | 7/2005 | Jangjian et al. | |
| 2005/0194475 A1 * | 9/2005 | Kim | C23C 16/507 239/690 |
| 2005/0199342 A1 | 9/2005 | Shajii et al. | |
| 2005/0241763 A1 | 11/2005 | Huang et al. | |
| 2006/0011237 A1 | 1/2006 | Tison et al. | |
| 2006/0060141 A1 | 3/2006 | Kamaishi et al. | |
| 2006/0097644 A1 | 5/2006 | Kano et al. | |
| 2006/0124169 A1 | 6/2006 | Mizusawa et al. | |
| 2006/0207595 A1 | 9/2006 | Ohmi et al. | |
| 2006/0237063 A1 | 10/2006 | Ding et al. | |
| 2007/0026684 A1 | 2/2007 | Parascandola et al. | |
| 2007/0066038 A1 | 3/2007 | Sadjadi et al. | |
| 2007/0158025 A1 | 7/2007 | Larson | |
| 2007/0175391 A1 | 8/2007 | Mizusawa | |
| 2007/0187363 A1 * | 8/2007 | Oka | H01J 37/3244 216/59 |
| 2007/0204797 A1 | 9/2007 | Fischer | |
| 2007/0204914 A1 | 9/2007 | Kurosawa et al. | |
| 2007/0233412 A1 | 10/2007 | Gotoh et al. | |
| 2007/0240778 A1 | 10/2007 | L'Bassi et al. | |
| 2007/0256785 A1 | 11/2007 | Pamarthy et al. | |
| 2007/0256786 A1 | 11/2007 | Zhou et al. | |
| 2007/0259112 A1 | 11/2007 | Ishikawa et al. | |
| 2008/0115834 A1 | 5/2008 | Geoffrion et al. | |
| 2008/0121178 A1 | 5/2008 | Bang et al. | |
| 2008/0202588 A1 | 8/2008 | Gold et al. | |
| 2008/0202609 A1 | 8/2008 | Gold et al. | |
| 2008/0202610 A1 * | 8/2008 | Gold | H01J 37/3244 137/597 |
| 2008/0223873 A1 | 9/2008 | Chen et al. | |
| 2008/0236749 A1 | 10/2008 | Koshimizu et al. | |
| 2009/0056629 A1 | 3/2009 | Katz et al. | |
| 2009/0061083 A1 | 3/2009 | Chiang et al. | |
| 2009/0061640 A1 | 3/2009 | Wong et al. | |
| 2009/0061644 A1 | 3/2009 | Chiang et al. | |
| 2009/0067954 A1 | 3/2009 | Lanee et al. | |

(56) References Cited

U.S. PATENT DOCUMENTS

| | | |
|---|---|---|
| 2009/0090174 A1 | 4/2009 | Paul et al. |
| 2009/0095364 A1 | 4/2009 | Itoh et al. |
| 2009/0183548 A1 | 7/2009 | Monkowski et al. |
| 2009/0183549 A1 | 7/2009 | Monkowski et al. |
| 2009/0197423 A1 | 8/2009 | Koshimizu et al. |
| 2009/0221117 A1 | 9/2009 | Tan et al. |
| 2009/0236313 A1 | 9/2009 | Qiu et al. |
| 2009/0272717 A1* | 11/2009 | Pamarthy .......... H01L 21/30655 216/37 |
| 2009/0320754 A1 | 12/2009 | Oya et al. |
| 2010/0012310 A1 | 1/2010 | Christensen et al. |
| 2010/0025369 A1 | 2/2010 | Negishi et al. |
| 2010/0030390 A1 | 2/2010 | Yamaguchi et al. |
| 2010/0071438 A1 | 3/2010 | Davis et al. |
| 2010/0122655 A1 | 5/2010 | Tiner et al. |
| 2010/0144539 A1 | 6/2010 | Bergh et al. |
| 2010/0145633 A1 | 6/2010 | Yasuda |
| 2010/0178770 A1 | 7/2010 | Zin |
| 2010/0216313 A1 | 8/2010 | Iwai |
| 2010/0229976 A1 | 9/2010 | Hirata et al. |
| 2010/0264117 A1 | 10/2010 | Ohmi et al. |
| 2010/0269924 A1 | 10/2010 | Yasuda |
| 2010/0330301 A1* | 12/2010 | Yang ................ C23C 16/4405 427/578 |
| 2011/0019332 A1 | 1/2011 | Chistyakov |
| 2011/0031111 A1 | 2/2011 | Kobayashi |
| 2011/0094596 A1 | 4/2011 | Sugiyama et al. |
| 2011/0135821 A1 | 6/2011 | Ding |
| 2011/0253225 A1 | 10/2011 | Beeby et al. |
| 2011/0265883 A1 | 11/2011 | Cruse et al. |
| 2011/0287631 A1 | 11/2011 | Yamamoto |
| 2011/0303696 A1 | 12/2011 | Kelekar et al. |
| 2012/0031500 A1 | 2/2012 | Hirose et al. |
| 2012/0034786 A1 | 2/2012 | Dhindsa et al. |
| 2012/0097266 A1 | 4/2012 | Cobb et al. |
| 2012/0149213 A1 | 6/2012 | Nittala et al. |
| 2012/0152364 A1 | 6/2012 | Hashimoto et al. |
| 2012/0156363 A1 | 6/2012 | Quinn et al. |
| 2012/0174990 A1 | 7/2012 | Yasuda |
| 2012/0190208 A1 | 7/2012 | Ozu et al. |
| 2012/0238102 A1 | 9/2012 | Zhang et al. |
| 2012/0238103 A1 | 9/2012 | Zhang et al. |
| 2012/0244715 A1 | 9/2012 | Lebouitz et al. |
| 2012/0247386 A1 | 10/2012 | Sanchez et al. |
| 2012/0289057 A1 | 11/2012 | DeDontney |
| 2012/0298221 A1 | 11/2012 | Takeuchi et al. |
| 2012/0305184 A1 | 12/2012 | Singh et al. |
| 2012/0328780 A1 | 12/2012 | Yamagishi |
| 2013/0008607 A1 | 1/2013 | Matsumoto et al. |
| 2013/0025715 A1 | 1/2013 | Yamaguchi et al. |
| 2013/0029494 A1 | 1/2013 | Sasaki et al. |
| 2013/0029496 A1 | 1/2013 | Bauer et al. |
| 2013/0045605 A1 | 2/2013 | Wang et al. |
| 2013/0085618 A1 | 4/2013 | Ding |
| 2013/0104996 A1 | 5/2013 | Oh et al. |
| 2013/0106286 A1 | 5/2013 | Banna et al. |
| 2013/0131300 A1 | 5/2013 | Olmscheid et al. |
| 2013/0145816 A1 | 6/2013 | Lowe |
| 2013/0157388 A1 | 6/2013 | Grimbergen |
| 2013/0220433 A1 | 8/2013 | Sawada et al. |
| 2013/0255784 A1 | 10/2013 | Ye et al. |
| 2013/0270997 A1 | 10/2013 | Zhao et al. |
| 2013/0284093 A1* | 10/2013 | Jang ................ H01J 37/32192 118/723 ME |
| 2013/0288477 A1 | 10/2013 | Rieschl et al. |
| 2014/0033828 A1 | 2/2014 | Larson et al. |
| 2014/0080308 A1 | 3/2014 | Chen et al. |
| 2014/0120737 A1 | 5/2014 | Swaminathan et al. |
| 2014/0141621 A1 | 5/2014 | Ren et al. |
| 2014/0144471 A1 | 5/2014 | Kahlon et al. |
| 2014/0182689 A1 | 7/2014 | Shareef et al. |
| 2014/0213055 A1 | 7/2014 | Himori et al. |
| 2014/0235069 A1* | 8/2014 | Breiling ................ F28F 3/02 438/778 |
| 2014/0248780 A1 | 9/2014 | Ingle et al. |
| 2014/0262038 A1 | 9/2014 | Wang et al. |
| 2014/0273460 A1 | 9/2014 | Reyland et al. |
| 2015/0010381 A1 | 1/2015 | Cai |
| 2015/0017810 A1 | 1/2015 | Guha |
| 2015/0059859 A1 | 3/2015 | Takahashi et al. |
| 2015/0181684 A1 | 6/2015 | Banna et al. |
| 2015/0184287 A1 | 7/2015 | Tsung et al. |
| 2015/0287572 A1 | 10/2015 | Daugherty et al. |
| 2015/0340209 A1 | 11/2015 | Koltonski |
| 2015/0354061 A1* | 12/2015 | Dhas ................ H01J 37/32091 427/570 |
| 2015/0371831 A1 | 12/2015 | Rozenzon et al. |
| 2016/0111258 A1 | 4/2016 | Taskar et al. |
| 2016/0181116 A1 | 6/2016 | Berry, III et al. |
| 2016/0211165 A1 | 7/2016 | McChesney et al. |
| 2016/0211166 A1 | 7/2016 | Yan et al. |
| 2016/0215392 A1 | 7/2016 | Yudovsky et al. |
| 2016/0247688 A1 | 8/2016 | Zhu et al. |
| 2016/0293431 A1 | 10/2016 | Sriraman et al. |
| 2017/0018407 A1 | 1/2017 | Kondo |
| 2017/0032982 A1 | 2/2017 | Drewery et al. |
| 2017/0069511 A1 | 3/2017 | Yang et al. |
| 2017/0110335 A1 | 4/2017 | Yang et al. |
| 2017/0200586 A1 | 7/2017 | Treadwell et al. |
| 2017/0213758 A1 | 7/2017 | Rice et al. |
| 2017/0236688 A1 | 8/2017 | Caron et al. |
| 2017/0236694 A1 | 8/2017 | Eason et al. |
| 2017/0236741 A1 | 8/2017 | Angelov et al. |
| 2017/0236743 A1 | 8/2017 | Severson et al. |
| 2017/0278679 A1 | 9/2017 | Angelov et al. |
| 2017/0287682 A1 | 10/2017 | Musselman et al. |
| 2017/0287753 A1 | 10/2017 | Musselman et al. |
| 2018/0053629 A1 | 2/2018 | Zhang et al. |
| 2019/0013232 A1 | 1/2019 | Yan et al. |

FOREIGN PATENT DOCUMENTS

| | | |
|---|---|---|
| CN | 102315150 A | 1/2012 |
| CN | 103730318 A | 4/2014 |
| CN | 104299929 A | 1/2015 |
| CN | 104752141 A | 7/2015 |
| CN | 104851832 A | 8/2015 |
| CN | 105336561 A | 2/2016 |
| CN | 107093569 A | 8/2017 |
| EP | 0424299 A2 | 4/1991 |
| EP | 0424299 A3 | 8/1991 |
| EP | 0838842 A2 | 4/1998 |
| JP | 2001-230239 A | 8/2001 |
| JP | 2015201552 A | 11/2015 |
| KR | 20040050080 A | 6/2004 |
| KR | 20050008792 A | 1/2005 |
| KR | 20080013552 A * | 2/2008 |
| KR | 20080023569 A | 3/2008 |
| KR | 20130137962 A | 12/2013 |
| KR | 20140001540 A | 1/2014 |
| KR | 101974420 B1 | 5/2019 |
| KR | 101974422 B1 | 5/2019 |
| TW | 506234 B | 10/2002 |
| TW | 201207933 A | 2/2012 |
| TW | 201324653 A | 6/2013 |
| TW | 201436089 | 9/2014 |
| WO | WO-0040776 A1 | 7/2000 |
| WO | WO-2007008509 A2 | 1/2007 |
| WO | WO-2011051251 A1 | 5/2011 |
| WO | WO-2013123617 A1 | 8/2013 |
| WO | WO-2014068886 A1 | 5/2014 |
| WO | WO-2014163742 A1 | 10/2014 |

OTHER PUBLICATIONS

U.S. Appl. No. 62/106,407, filed Jan. 22, 2015, in the names of Joseph Yudovsky et al., & entitled "Injector for Spatially Separated Atomic Layer Deposition Chamber" pp. 1-68. (Year: 2015).

U.S. Appl. No. 62/065,497, entitled "Gas Supply Delivery Arrangement Including a Gas Splitter for Tunable Gas Flow Control," filed Oct. 17, 2014, in the names of Mark Taskar et al. (Year: 2014).

First Office Action dated Aug. 2, 2018 corresponding to Chinese Patent Application No. 201710036188.9, 7 pages.

(56) References Cited

OTHER PUBLICATIONS

First Office Action dated Dec. 29, 2017 corresponding to Chinese Patent Application No. 201610032252.1, 12 pages.
MP125E N-470 Linear Drive User Manual; Version 1.1.0; Date Sep. 18, 2014; 54 Pages; Physik Instruments (PI) GmbH & Co. KG, Auf der Roemerstr. 1, 76228 Karlsruhe, Germany.
Blain (Mar./ Apr. 1999) "Mechanism of nitrogen removal from silicon nitride by nitric oxide," Journal of Vacuum Science & Technology A, 17(2):665-667.
Blain et al. (Jul./Aug. 1996) "Role of nitrogen in the downstream etching of silicon nitride," Journal of Vacuum Science & Technology A, 14(4):2151-2157.
Bohr, Mark, "The New Era of Scaling in an SoC World" Intel Logic Technology Development; ISSCC; 2009; 66 Pages.
Dusa, Mircean et al., "Pitch Doubling Through Dual Patterning Lithography Challenges in Integration and Litho Budgets," Optical Microlithography XX, vol. 6520, 65200G, (2007); 10 pages.
European Extended Search Report dated May 30, 2016 issued in EP 15 199 363.1.
Kastenmeier et al. (Nov./Dec. 1999) "Highly selective etching of silicon nitride over silicon and silicon dioxide," J. Vac. Sci. Technol. A, American Vacuum Society, 17 (6):3179-3184.

Kastenmeier et al. (Sep./Oct. 1996) "Chemical dry etching of silicon nitride and silicon dioxide using CF4/02/N2 gas mixtures," J. Vac. Sci. Technol. A14(5):2802-2813.
Oehrlein et al. (1996) "Study of plasma-surface interactions: chemical dry etching and high-density plasma etching," Plasma Sources Sci. Technol. 5:193-199.
Tajima et al. (2013) "Room-Temperature Si Etching in NO/F2 Gases and the Investigation of Surface Reaction Mechanisms," The Journal of Physical Chemistry C, 117:5118-5125.
U.S. Office Action dated Oct. 5, 2015 issued in U.S. Appl. No. 14/576,020 [LAMRP146].
U.S. Final Ofice Action dated Feb. 26, 2016 issued in U.S. Appl. No. 14/576,020 [LAMRP146].
U.S. Office Action dated Sep. 23, 2016 issued in U.S. Appl. No. 14/576,020 [LAMRP146].
Yun et al. (2007) "Large Etch Rate Enhancement by NO-Induced Surface Chemical Reaction during Chemical Dry Etching of Silicon Oxide in F2 Remote Plasmas," Journal of the Electrochemical Society, 154(4):D267-D272.
First Chinese Office Action for Chinese Application No. 201710013856.6 dated Oct. 21, 2019.

* cited by examiner

SUBSTRATE PROCESSING CHAMBER INCLUDING MULTIPLE GAS INJECTION POINTS AND DUAL INJECTOR

CROSS-REFERENCE TO RELATED APPLICATIONS

This application claims the benefit of U.S. Provisional Application No. 62/275,837, filed on Jan. 7, 2016. The entire disclosure of the application referenced above is incorporated herein by reference.

FIELD

The present disclosure relates to substrate processing systems and methods, and more particularly to substrate processing systems and methods for etching and ashing substrates.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems may be used to etch or ash film on a substrate such as a semiconductor wafer. The substrate processing systems typically include a processing chamber, a gas distribution device such as a showerhead and a substrate support. During processing, the substrate is arranged on the substrate support. Different gas mixtures may be introduced into the processing chamber and radio frequency (RF) plasma may be used to activate chemical reactions.

Substrate processing systems typically use single points of gas injection. These systems also typically require gases to be mixed into a gas mixture before the gas mixture is delivered by the same gas lines to the substrate processing chamber. Problems encountered when using this approach include the inability to use incompatible gases (such as pyrophoric and oxidizing gases) due to chemical reactions in the gas lines before the gases reach the substrate processing chamber. Gas flow direction and reaction locations in the substrate processing chamber are usually optimized for a single process and generally require hardware changes to optimize performance for each additional process to be performed. In many applications, the gases enter through an RF source. These gases are typically ionized before travelling through the showerhead.

SUMMARY

A substrate processing system includes an upper chamber and a coil arranged around the upper chamber. An RF generating system supplies RF power to the coil to create plasma in the upper chamber. A first support supports a lower portion of the upper chamber and includes a first plurality of gas flow channels to deliver a first tuning gas flow in an upward and radially inward direction into the upper chamber. A gas injector is arranged in an upper portion of the upper chamber to deliver a plasma gas mixture in at least one of a downward or a downward and radially outward direction. A second support is arranged between the first support and the lower chamber and includes a second plurality of gas flow channels to deliver second tuning gas flow in a downward and radially inward direction into the lower chamber. A substrate support supports a substrate and is arranged in the lower chamber. A gas distribution device includes a plurality of gas through holes and is arranged between the upper chamber and the lower chamber. A gas delivery system supplies the first tuning gas flow to the first plurality of gas flow channels, the plasma gas mixture to the gas injector, and the second tuning gas flow to the second plurality of gas flow channels.

In other features, the gas distribution device is grounded. The gas delivery system supplies a first gas flow and a second gas flow to the gas injector. The gas injector independently delivers the first gas flow and the second gas flow to the upper chamber without mixing in the gas injector.

In other features, the gas injector includes a first injector housing including a base portion including a first gas flow channel to receive the first gas flow; a projecting portion extending from the base portion; and a second gas flow channel to receive the second gas flow and extending through the base portion and the projecting portion. The gas injector includes a second injector housing including a first cavity including a first opening, a second opening and a first plurality of gas through holes arranged around the second opening and extending from the first cavity through the second injector housing; and a second cavity that includes a second plurality of gas through holes extending from the second cavity though through the second injector housing and that extends from the second opening of the first cavity. The base portion sealingly sealing engages with the first opening of the first cavity. The projecting portion sealingly engages with the second cavity.

In other features, the first cavity has a first diameter and the second cavity has a second diameter that is smaller than the first diameter. The projecting portion includes a groove. An O-ring is arranged in the groove to sealingly engage with an inner surface of the second cavity. The base portion has a "T"-shaped cross section. At least two of the first plurality of gas through holes is arranged at an acute outward angle relative to a downward direction. At least two of the second plurality of gas through holes is arranged at an acute outward angle relative to a downward direction.

In other features, at least one of the second plurality of gas through holes is arranged in a downward direction and at least two of the second plurality of gas through holes are arranged at an acute outward angle relative to the downward direction.

In other features, the first gas flow is supplied at a first flow rate and the second gas flow is supplied at a second flow rate that is different than the first flow rate. The first gas flow includes a first gas mixture and the second gas flow includes a second gas mixture that is different than the first gas mixture.

A gas injector for a substrate processing system includes a first injector housing including a base portion defining a first gas flow channel; a projecting portion extending from the base portion; and a second gas flow channel extending through the base portion and the projecting portion. The gas injector includes a second injector housing including a first cavity including a first opening, a second opening and a first plurality of gas through holes arranged around the second opening. The first gas flow channel is in fluid communication with the first plurality of gas through holes. The second injector housing includes a second cavity that includes a second plurality of gas through holes and that extends from the second opening of the first cavity. The second gas flow channel is in fluid communication with the second plurality of gas through holes. The base portion sealingly engages with the first opening of the first cavity, the projecting portion sealingly engages with the second cavity, and gas flows through the first gas flow channel into a processing chamber of the substrate processing system without mixing in the gas injector with gas flowing through the second gas flow channel.

In other features, the first cavity has a first diameter and the second cavity has a second diameter that is smaller than the first diameter.

In other features, the projecting portion includes a groove and further comprising an O-ring arranged in the groove to sealingly engage with an inner surface of the second cavity. The base portion has a "T"-shaped cross section.

In other features, at least two of the first plurality of gas through holes is arranged at an acute outward angle relative to a downward direction. At least two of the second plurality of gas through holes is arranged at an acute outward angle relative to a downward direction.

In other features, at least one of the second plurality of gas through holes is arranged in the downward direction and at least two of the second plurality of gas through holes are arranged at an acute outward angle relative to the downward direction.

A substrate processing system includes the gas injector, an upper chamber, a lower chamber and a substrate support that supports a substrate and that is arranged in the lower chamber. A gas delivery system supplies a first gas flow to the first gas flow channel and a second gas flow to the second gas flow channel. A gas distribution device includes a plurality of gas through holes and is arranged between the upper chamber and the lower chamber. The gas injector supplies gas to the upper chamber.

In other features, a coil is arranged around the upper chamber. An RF generating system supplies RF power to the coil to create plasma in the upper chamber.

In other features, the first gas flow is supplied at a first flow rate and the second gas flow is supplied at a second flow rate that is different than the first flow rate. The first gas flow includes a first gas mixture and the second gas flow includes a second gas mixture that is different than the first gas mixture.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

Systems and methods according to the present disclosure allow tuning of gas species and gas delivery paths in a substrate processing system. In some examples, the substrate processing system performs etching or ashing. Multiple gas injection locations are provided and each gas injection location is supplied by a gas delivery system or a gas metering system. Tuning of gas delivery at each of the gas injection locations may be used to adjust etch or ash rate uniformity and/or selectivity on the substrate.

In some examples, the multiple injection locations allow gas delivery to be adjusted such that the volume of ionized species can be moved simply by adjusting a flow rate to a particular injection location. In other examples, incompatible gases flow through different injection locations to prevent mixing before the gases reach the substrate processing chamber. This also allows for separate injection of shielding or carrier gases without mixing with main process gases before delivery to the substrate processing chamber.

In some examples, a gas injector includes multiple injector locations to reduce hardware complexity and potential leak locations. The gas injector includes two or more separate gas delivery paths that do not allow the gases to mix until the gases enter the substrate processing chamber. In some examples, the gas delivery paths are pointed in the same or different directions to help tune wafer uniformity.

Figure 1:
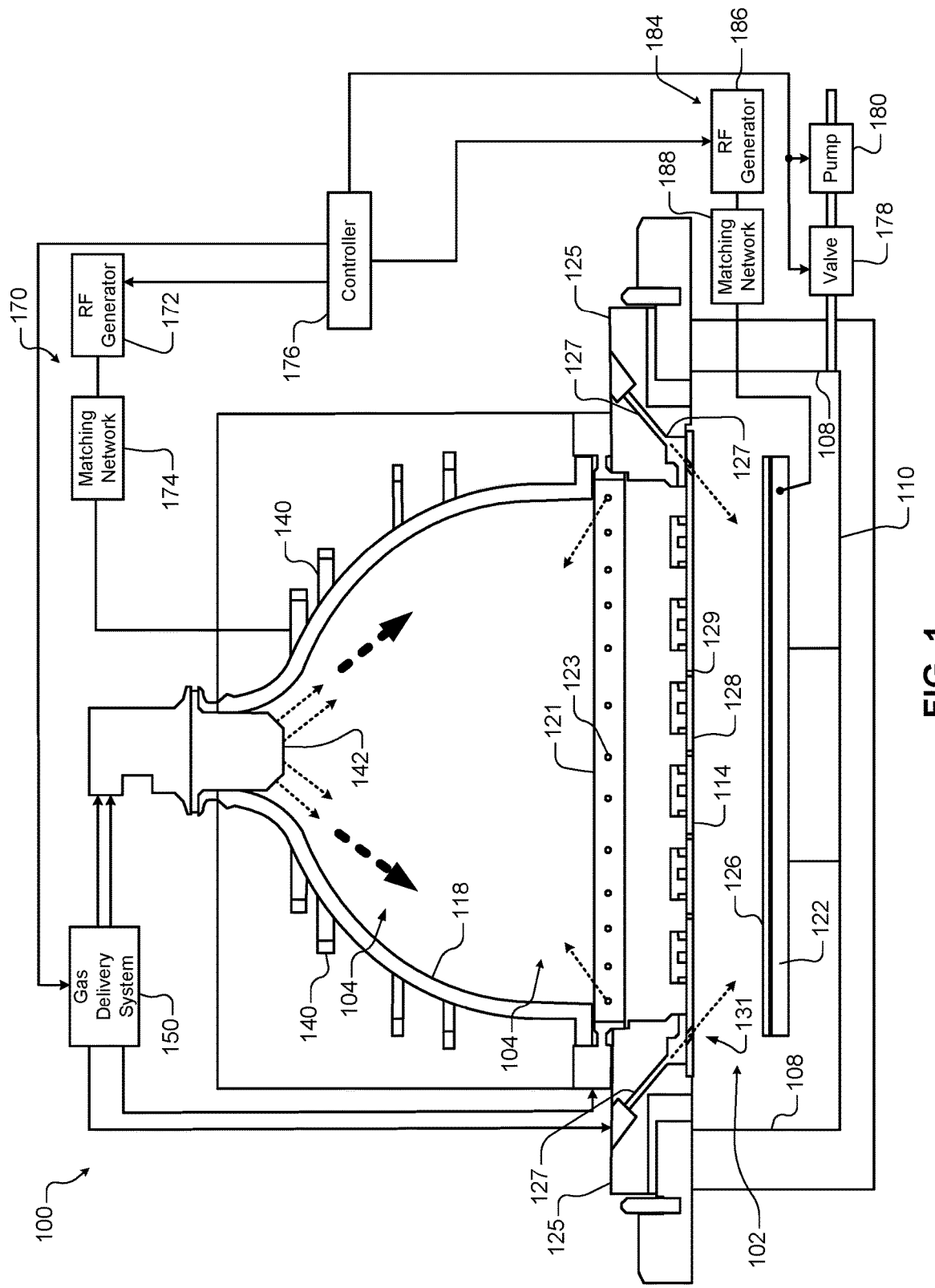
FIG. 1 is a functional block diagram of an example of a substrate processing system according to the present disclosure.

Referring now to FIG. 1, a substrate processing chamber 100 for etching or ashing a substrate according to the present disclosure is shown. While a specific type of substrate processing chamber is shown and described, the improvements described herein may be applied to a variety of other substrate processing chambers.

The substrate processing chamber 100 includes a lower chamber region 102 and an upper chamber region 104. The lower chamber region 102 is defined by chamber sidewall surfaces 108, a chamber bottom surface 110 and a lower surface of a gas distribution device 114.

The upper chamber region 104 is defined by an upper surface of the gas distribution device 114 and an inner surface 118 of the upper chamber region 104. In some examples, the upper chamber region 104 may have a dome shape, although other shapes can be used. In some examples, the upper chamber region 104 rests on a first support 121. In some examples, the first support 121 has an annular shape. In some examples, the first support 121 includes one or more gas flow channels 123 for delivering process gas to the upper chamber region 104, as will be described further below. In some examples, the process gas is delivered by the one or more gas flow channels 123 in an upward direction at an acute angle relative to a plane including the gas distribution device 114, although other angles/directions may be used. In some examples, the gas flow channels 123 are uniformly spaced around the first support 121.

The first support 121 may rest on a second support 125. In some examples, the second support has an annular shape. The second support 125 defines one or more gas flow channels 127 for delivering process gas to the lower chamber region 102. In some examples, the gas flow channels are uniformly spaced around the second support 125. In some examples, gas through holes 131 in the gas distribution device 114 align with the gas flow channels 127. In other examples, the gas distribution device 114 has a smaller diameter and the gas through holes 131 are not needed. In some examples, the process gas is delivered by the one or more gas flow channels 127 in a downward direction towards the substrate at an acute angle relative to the plane including the gas distribution device 114, although other angles/directions may be used.

In other examples, the upper chamber region 104 is cylindrical with a flat top surface and a flat inductive coil may be used. In still other examples, a single chamber may be used with a spacer located between a showerhead and the substrate support.

A substrate support 122 is arranged in the lower chamber region 102. In some examples, the substrate support 122 includes an electrostatic chuck (ESC), although other types of substrate supports can be used. A substrate 126 is arranged on an upper surface of the substrate support 122 during etching. In some examples, a temperature of the substrate 126 may be controlled by a heater plate, an optional cooling plate with fluid channels and one or more sensors (all not shown); although any other suitable substrate support temperature control system may be used.

In some examples, the gas distribution device 114 includes a showerhead (for example, a plate 128 having a plurality of through holes 129). The plurality of through holes 129 extend from the upper surface of the plate 128 to the lower surface of the plate 128. In some examples, the through holes 129 have a diameter in a range from 0.4" to 0.75" and the showerhead is made of a conducting material such as aluminum or a non-conductive material such as ceramic with an embedded electrode made of a conducting material.

One or more inductive coils 140 are arranged around an outer portion of the upper chamber region 104. When energized, the one or more inductive coils 140 create an electromagnetic field inside of the upper chamber region 104. A gas injector 142 injects one or more gas mixtures from a gas delivery system 150. In some examples, the gas injector 142 includes a center injection location that directs gas in a downward direction and one or more side injection locations that inject gas at an angle with respect to the downward direction. In some examples, the gas delivery system 150 delivers a first portion of the gas mixture at a first flow rate to the center injection location and a second portion of the gas mixture at a second flow rate to the side injection location(s) of the gas injector 142. In other examples, different gas mixtures are delivered by the gas injector 142. In some examples, the gas delivery system 150 delivers tuning gas to the gas flow channels 123 and 127 and/or to other locations in the processing chamber as will be described below. In some examples, the tuning gas is varied to adjust etch or ash rates and/or selectivity by varying a location of the volume of ionized species.

A plasma generator 170 may be used to generate RF power that is output to the one or more inductive coils 140. Plasma is generated in the upper chamber region 104. In some examples, the plasma generator 170 includes an RF generator 172 and a matching network 174. The matching network 174 matches an impedance of the RF generator 172 to the impedance of the one or more inductive coils 140. In some examples, the gas distribution device 114 is connected to a reference potential such as ground. A valve 178 and a pump 180 may be used to control pressure inside of the lower and upper chamber regions 102, 104 and to evacuate reactants from the lower and upper chamber regions 102, 104, respectively.

A controller 176 communicates with the gas delivery system 150, the valve 178, the pump 180, and/or the plasma generator 170 to control flow of process gas, purge gas, RF plasma and chamber pressure. In some examples, plasma is sustained inside the upper chamber region 104 by the one or more inductive coils 140. One or more gas mixtures are introduced from a top portion of the chamber using the gas injector 142 and plasma is confined within the upper chamber region 104 using the gas distribution device 114, which may be grounded.

Confining the plasma in the upper chamber region 104 allows volume recombination of plasma species and effusing desired etchant species through the gas distribution device 114. In some examples, there is no RF bias applied to the substrate 126. As a result, there is no active sheath on the substrate 126 and ions are not hitting the substrate with any finite energy. Some amount of ions will diffuse out of the plasma region through the gas distribution device 114. However, the amount of plasma that diffuses is an order of magnitude lower than the plasma located inside the upper chamber region 104. Most of ions in the plasma are lost by volume recombination at high pressures. Surface recombination loss at the upper surface of the gas distribution device 114 also lowers ion density below the gas distribution device 114.

In other examples, an RF bias generator 184 is provided and includes an RF generator 186 and a matching network 188. The RF bias can be used to create plasma between the gas distribution device 114 and the substrate support or to create a self-bias on the substrate 126 to attract ions. The controller 176 may be used to control the RF bias.

Figure 2:
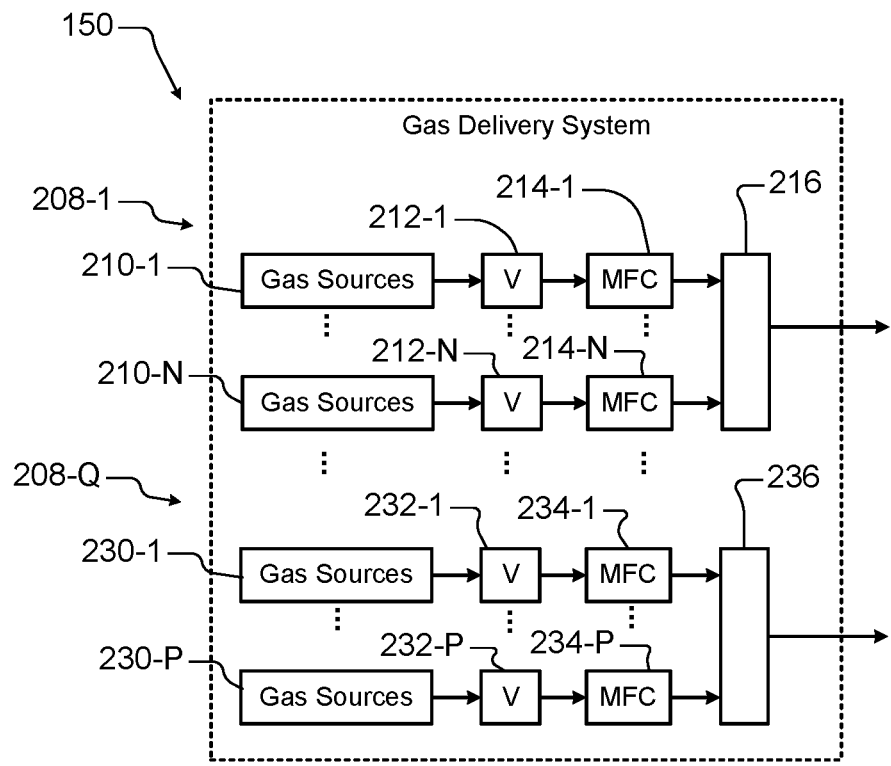
FIG. 2 is a functional block diagram of an example of a gas delivery system according to the present disclosure.

As described above, the same gas mixture can be provided at different flow rates and/or different gas mixtures can be provided. Referring now to FIG. 2, a first example of the gas delivery system 150 provides two or more gas mixtures via two or more gas channels 208-1, . . . , and 208-Q (collectively gas channels 208). The gas channel 208-1 includes one or more gas sources 210-1, . . . , and 210-N (collectively gas sources 210), one or more valves 212-1, . . . , and 212-N (collectively valves 212), one or more mass flow controllers (MFCs) 214-1, . . . , and 214-N (collectively MFCs 214), and a mixing manifold 216. Another gas channel 208-Q includes one or more gas sources 230-1, . . . , and 230-P (collectively gas sources 230), one or more valves 232-1, . . . , and 232-P (collectively valves 232), one or more mass flow controllers (MFCs) 234-1, . . . , and 234-P (collectively MFCs 234), and a mixing manifold 236. N, P and Q are integers greater than or equal to one. Each of the gas channels 208 can supply a different gas mixture to the gas injector 142 or other injection zones in the substrate processing chamber. The different gas mixtures are supplied to various zones of the substrate processing chamber described herein.

Figure 3:
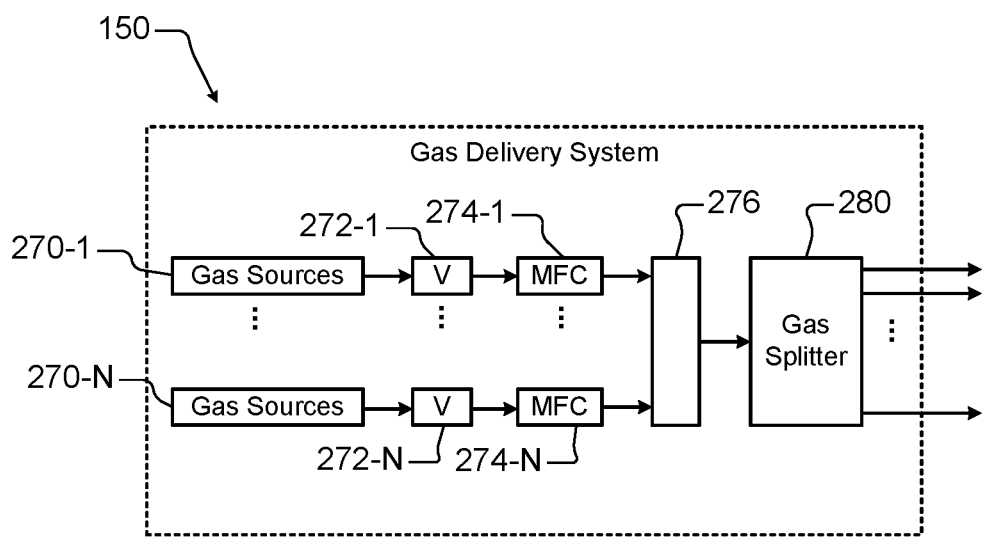
FIG. 3 is a functional block diagram of another example of a gas delivery system according to the present disclosure.

Referring now to FIG. 3, another example of the gas delivery system 150 splits a gas mixture into two or more gas flows having different flow rates. Each gas channel in the gas delivery system 150 includes one or more gas sources 270-1, . . . , and 270-N (collectively gas sources 270), one or more valves 272-1, . . . , and 272-N (collectively valves 272), one or more mass flow controllers (MFCs) 274-1, . . . , and 274-N (collectively MFCs 274), and a mixing manifold 276. The gas mixture output by the mixing manifold 276 may be split by a gas splitter 280 into two or more gas flows each having the same gas mixture and a different flow rate. The gas splitter 280 may include one or more channels each including a valve and a restricted orifice. Sizes of the restricted orifices may be selected using the valves to provide various desired flow rates. The different portions of the gas mixtures are supplied at the different flow rates to various zones of the substrate processing chamber.

In some examples, the arrangements disclosed in FIGS. 2 and 3 are combined to provide one gas mixture at one flow rate (or one or more different flow rates) and one or more other gas mixtures at one flow rate (or at one or more different flow rates).

Figure 4:
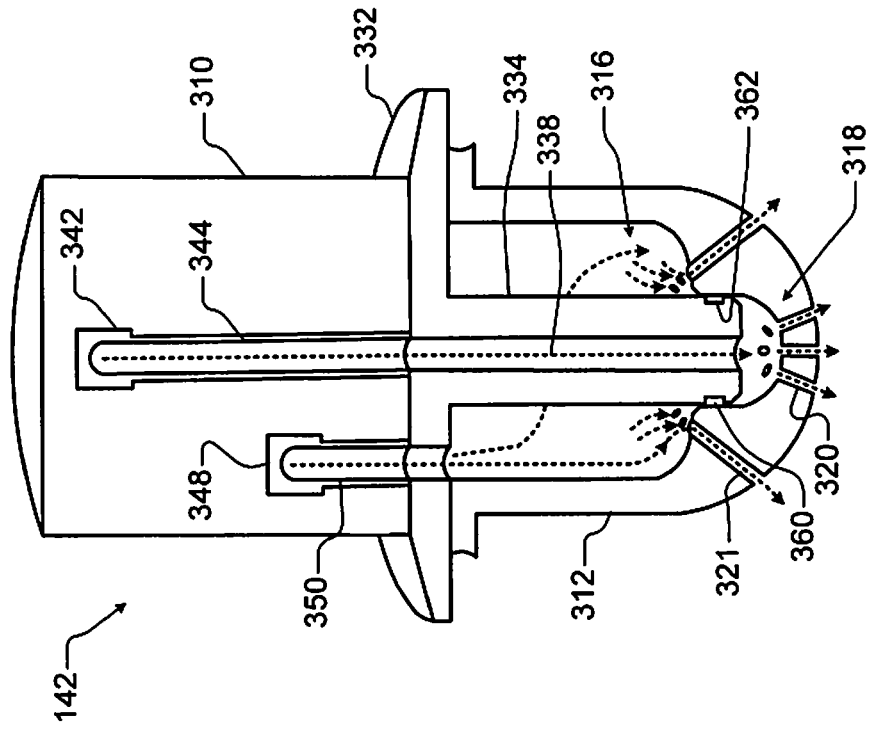
FIG. 4 is partial perspective and side cross-sectional view of an example of a dual gas injector according to the present disclosure.
Figure 5:
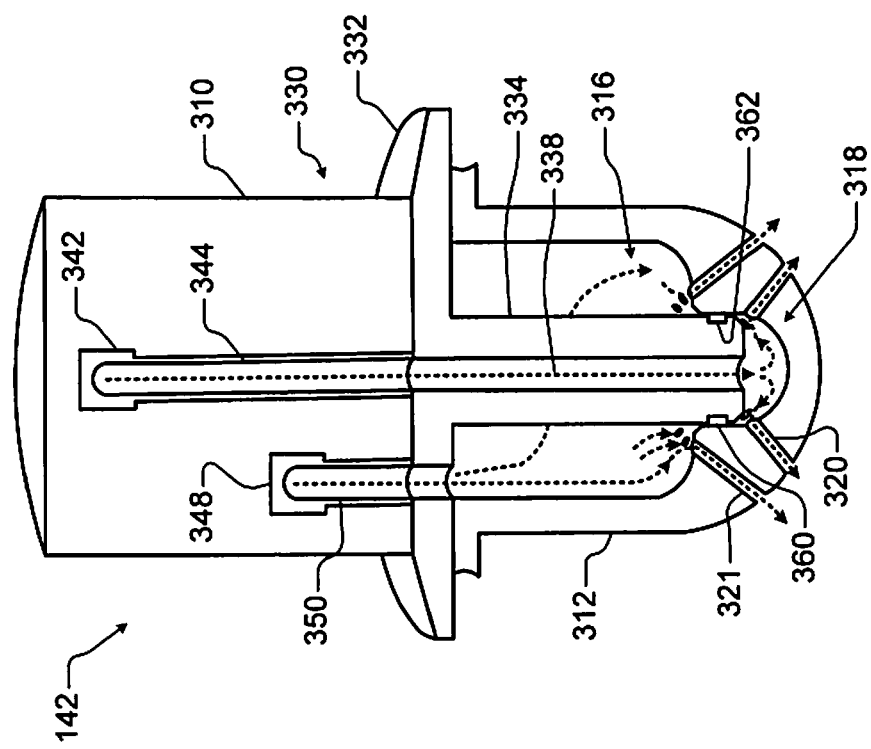
FIG. 5 is partial perspective and side cross-sectional view of another example of a dual gas injector according to the present disclosure.

Referring now to FIGS. 4-5, examples of the gas injector 142 are shown. In FIG. 4, the gas injector 142 includes an upper or first injector housing 310 and a lower or second injector housing 312. The lower injector housing 312 defines a first cavity 316 and a second cavity 318 extending downwardly from one end of the first cavity 316. In some examples, the second cavity 318 has a smaller diameter than the first cavity 316. One or more gas through holes 320 in the second cavity 318 are in fluid communication with the substrate processing chamber. In some examples, the one or more gas through holes 320 is arranged in a generally circular pattern about a lower surface of the second cavity 318. One or more gas through holes 321 in the first cavity 316 are in fluid communication with the substrate processing chamber. In some examples, the one or more gas through holes 321 is arranged in a generally circular pattern about a lower surface of the first cavity 316.

An upper portion 330 of the gas injector 142 includes a base portion 332 that extends radially outwardly relative to an outer surface of the lower injector housing and a projecting portion 334 that projects downwardly from a center of the base portion 332. In some examples, the base portion 332 has a generally "T"-shaped cross section. The projecting portion 334 has an outer diameter that is substantially equal to an inner diameter of the second cavity 318. An abutting relationship is created when the end of the projecting portion 334 is inserted in the second cavity 318.

In some examples, a seal formed between the outer diameter of the projecting portion 334 and the inner diameter of the second cavity 318. In some examples, the seal includes an "O"-ring 360 that is arranged in a groove 362 formed on an outer diameter of the projecting portion 334. In some examples, the groove is formed on the surface defining the second cavity 318. The projecting portion 334 defines a gas flow channel 338 that extends from one end of the projecting portion 334 to an opposite end of the projecting portion 334.

A conduit carrying a first gas mixture is connected to gas fittings 342. The first gas mixture flows through a flow channel defined by a conduit 344 and the gas flow channel 338 into the second cavity 318. The first gas mixture flows through the gas through holes 320 into the upper chamber region 104. A conduit carrying a second gas mixture is connected to fittings 348. The second gas mixture flows through a flow channel defined by conduit 350 into the first cavity 316. The second gas mixture flows through the gas through holes 321 into the upper chamber region 104. Elements 350 and 338 may be respectively called first and second gas flow channels.

In FIG. 5, the gas through holes 320 and 321 may be arranged in other locations, at other angles, and/or at other relative angles to effectuate different gas mixing characteristics.

Figure 6:
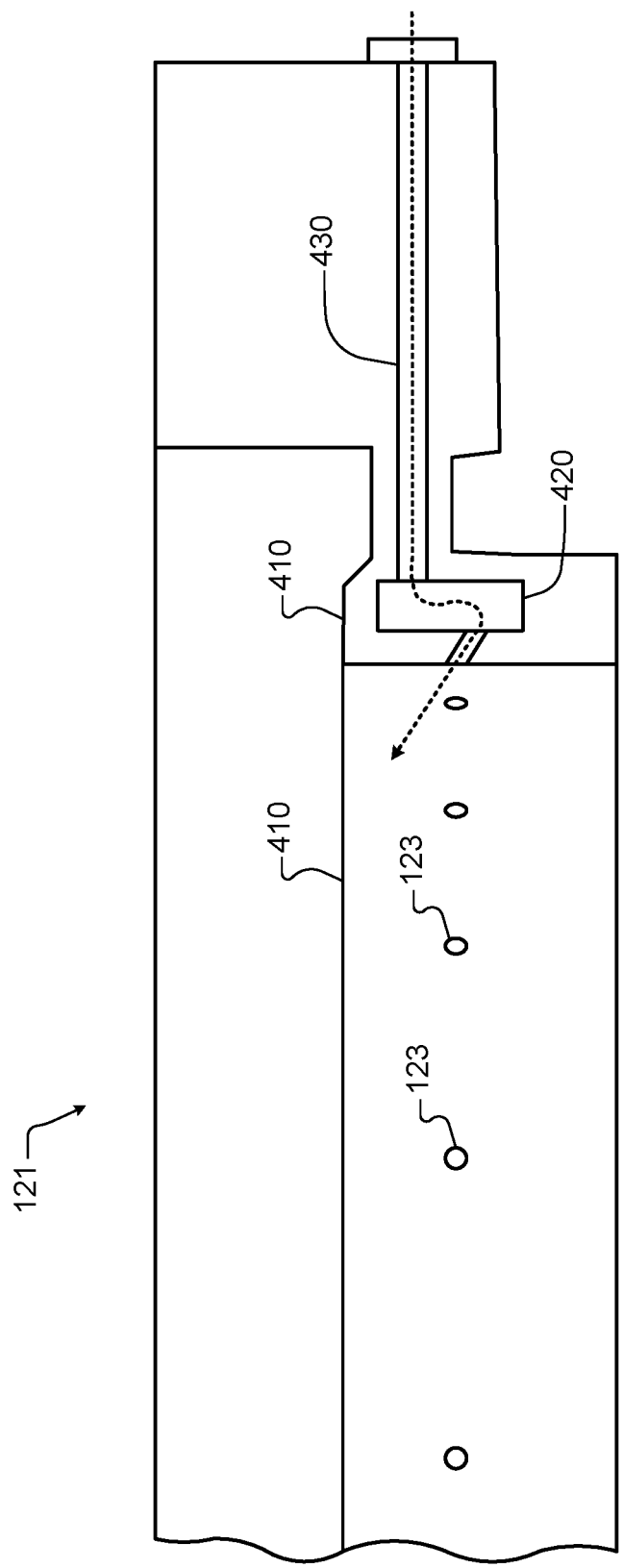
FIG. 6 is a side cross-sectional view of an example of a lower support including a gas plenum and one or more holes for directing gas upwardly into the upper chamber region.

Referring now to FIG. 6, the first support 121 defines a first portion 410 including a gas flow channel 420 that may extend fully or partially around the periphery of the substrate processing chamber. In some examples, the gas flow channel 420 has an annular shape. The gas flow channel 420 is in fluid communication with a source of process gas. For example, the gas flow channel 420 may be connected by conduit(s) 430 to one or more gas sources, gas mixture sources, manifolds and/or outputs of gas splitters.

The one or more gas flow channels 123 are in fluid communication with the gas flow channel 420 and direct gas from the gas flow channel 420 into the upper chamber region 104. In some examples, the one or more gas flow channels 123 are arranged in a spaced relationship around the processing chamber. In some examples, the one or more gas flow channels 123 direct gas flow from the gas flow channel 420 at an acute radially-inward angle relative to the upper surface of the gas distribution device 114.

Advantages of the systems and methods described herein include tunability of process gas flow direction, the ability to keep incompatible gases separate until they enter the process cavity, the ability to flow gases above and below the showerhead, and the ability to flow two or more separate gases through one injector.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A substrate processing system, comprising:
   an upper chamber;
   a coil arranged around the upper chamber;
   an RF generator to supply RF power to the coil to create plasma in the upper chamber;
   a first support to support a lower portion of the upper chamber and including a first plurality of gas flow channels to deliver a first tuning gas flow in an upward and radially inward direction into the upper chamber;
   a gas injector arranged in an upper portion of the upper chamber to deliver a plasma gas mixture in at least one of a downward or a downward and radially outward direction;
   a lower chamber;
   a second support arranged between the first support and the lower chamber and including a second plurality of gas flow channels to deliver second tuning gas flow in a downward and radially inward direction into the lower chamber, wherein the first support rests on the second support;
   a substrate support that supports a substrate and that is arranged in the lower charter;
   a gas distribution device including a plate that includes a plurality of gas through holes and that is arranged between the upper chamber and the lower charter, wherein the gas distribution device is arranged between the second support and the substrate support, and wherein the gas through holes include a first plurality of gas through holes of the plate that allow the plasma gas mixture into the lower chamber and a second plurality of gas through holes of the plate aligned with the second plurality of gas flow channels to delivery of the second tuning gas flow in the downward and radially inward direction from the second support into the lower chamber; and
   a plurality of gas sources configured to supply the first tuning gas flow to the first plurality of gas flow channels, the plasma gas mixture to the gas injector, and the second tuning gas flow to the second plurality of gas flow channels.

2. The substrate processing system of claim 1, wherein the gas distribution device is grounded.

3. The substrate processing system of claim 1, wherein the gas delivery system supplies a first gas flow and a second gas flow to the gas injector and wherein the gas injector independently delivers the first gas flow and the second gas flow to the upper chamber without mixing in the gas injector.

4. The substrate processing system of claim 3, wherein the gas injector includes:

a first injector housing including:
- a base portion including a first gas flow channel to receive the first gas flow;
- a projecting portion extending from the base portion; and
- a second gas flow channel to receive the second gas flow and extending through the base portion and the projecting portion; and a second injector housing including:
- a first cavity including a first opening, a second opening and a first plurality of gas through holes arranged around the second opening and extending from the first cavity through the second injector housing; and
- a second cavity that includes a second plurality of gas through holes extending from the second cavity through the second injector housing and wherein the second cavity extends from the second opening of the first cavity,
- wherein the base portion sealingly engages with the first opening of the first cavity, and
- wherein the projecting portion sealingly engages with the second cavity.

5. The substrate processing system of claim 4, wherein the first cavity has a first diameter and wherein the second cavity has a second diameter that is smaller than the first diameter.

6. The substrate processing system of claim 4, wherein the projecting portion includes a groove and further comprising an O-ring arranged in the groove to sealingly engage with an inner surface of the second cavity.

7. The substrate processing system of claim 4, wherein the base portion has a "T"-shaped cross section.

8. The substrate processing system of claim 4, wherein at least two of the first plurality of gas through holes are arranged at an acute outward angle relative to a downward direction.

9. The substrate processing system of claim 4, wherein at least two of the second plurality of gas through holes are arranged at an acute outward angle relative to a downward direction.

10. The substrate processing system of claim 4, wherein at least one of the second plurality of gas through holes is arranged in a downward direction and at least two of the second plurality of gas through holes are arranged at an acute outward angle relative to the downward direction.

11. The substrate processing system of claim 3, wherein the first gas flow is supplied at a first flow rate and the second gas flow is supplied at a second flow rate that is different than the first flow rate.

12. The substrate processing system of claim 3, wherein the first gas flow includes a first gas mixture and the second gas flow includes a second gas mixture that is different than the first gas mixture.

13. The substrate processing system of claim 1, wherein the second support has a greater outer diameter than the first support.

* * * * *